(12) United States Patent
Karp et al.

(10) Patent No.: US 7,919,845 B2
(45) Date of Patent: Apr. 5, 2011

(54) FORMATION OF A HYBRID INTEGRATED CIRCUIT DEVICE

(75) Inventors: James Karp, Saratoga, CA (US); Steven P. Young, Boulder, CO (US); Bernard J. New, Carmel Valley, CA (US); Scott S. Nance, Grass Valley, CA (US); Patrick J. Crotty, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 510 days.

(21) Appl. No.: 12/004,906

(22) Filed: Dec. 20, 2007

(65) Prior Publication Data
US 2009/0160482 A1 Jun. 25, 2009

(51) Int. Cl.
H01L 23/02 (2006.01)

(52) U.S. Cl. ........ 257/686; 257/757; 257/767; 257/787; 257/E21.504; 257/E21.525; 257/E21.705; 257/E23.007; 257/E23.069; 257/E23.179; 257/E25.013

(58) Field of Classification Search .......... 257/686–787, 257/E21.504–525, 23.004–23.007, 69, 179, 257/25.013–25.023
See application file for complete search history.

(56) References Cited

U.S. PATENT DOCUMENTS

| | | | | |
|---|---|---|---|---|
| 5,585,282 | A * | 12/1996 | Wood et al. .................... | 438/613 |
| 5,696,031 | A * | 12/1997 | Wark ............................... | 438/4 |
| 5,729,894 | A * | 3/1998 | Rostoker et al. ................ | 29/832 |
| 6,071,754 | A * | 6/2000 | Wark ............................. | 438/106 |
| 6,140,149 | A * | 10/2000 | Wark ............................. | 438/105 |
| 6,399,416 | B1 * | 6/2002 | Wark ............................. | 438/106 |
| 6,500,760 | B1 * | 12/2002 | Peterson et al. ............... | 438/684 |
| 6,501,165 | B1 * | 12/2002 | Farnworth et al. ............ | 257/686 |
| 7,064,579 | B2 | 6/2006 | Madurawe | |
| 7,068,072 | B2 | 6/2006 | New et al. | |
| 7,075,175 | B2 | 7/2006 | Kazi et al. | |
| 7,091,598 | B2 | 8/2006 | Fujita et al. | |
| 7,132,311 | B2 * | 11/2006 | Akiba et al. .................. | 438/109 |

(Continued)

OTHER PUBLICATIONS

Tezzaron Semiconductor, FaStack Technology, "FaStack Creates 3D Integrated Circuits", 3 pages, revised on May 23, 2007, http://www.tezzaron.com/technology/FaStack.htm (printed on Dec. 20, 2007).
Tezzaron Semiconductor, "FaStack Stacking Technology" 1-4 pages, Rev. 1.4, Feb. 2004.
Gupta, et al., entitled "Techniques for Producing 3DICs with High-Density Interconnect", Tezzaron Semiconductor Corporation, VMIC, 5 pages, Sep. 2004.

*Primary Examiner* — Michael S Lebentritt
(74) *Attorney, Agent, or Firm* — W. Eric Webostad; John J. King

(57) ABSTRACT

Formation of a hybrid integrated circuit device is described. A design for the integrated circuit is obtained and separated into at least two portions responsive to component sizes. A first die is formed for a first portion of the hybrid integrated circuit device using at least in part a first minimum dimension lithography. A second die is formed for a second portion of the device using at least in part a second minimum dimension lithography, where the second die has the second minimum dimension lithography as a smallest lithography used for the forming of the second die. The first die and the second die are attached to one another via coupling interconnects respectively thereof to provide the hybrid integrated circuit device.

15 Claims, 9 Drawing Sheets

U.S. PATENT DOCUMENTS

| | | | |
|---|---|---|---|
| 7,301,234 B2 * | 11/2007 | Lee | 257/723 |
| 7,501,696 B2 * | 3/2009 | Koyama et al. | 257/686 |
| 7,609,561 B2 | 10/2009 | Cornwell et al. | |
| 2002/0066956 A1 | 6/2002 | Taguchi | |
| 2004/0178819 A1 | 9/2004 | New | |
| 2005/0007147 A1 | 1/2005 | Young | |
| 2006/0237835 A1 | 10/2006 | Fujita et al. | |
| 2007/0001168 A1 * | 1/2007 | Kirby et al. | 257/48 |

* cited by examiner

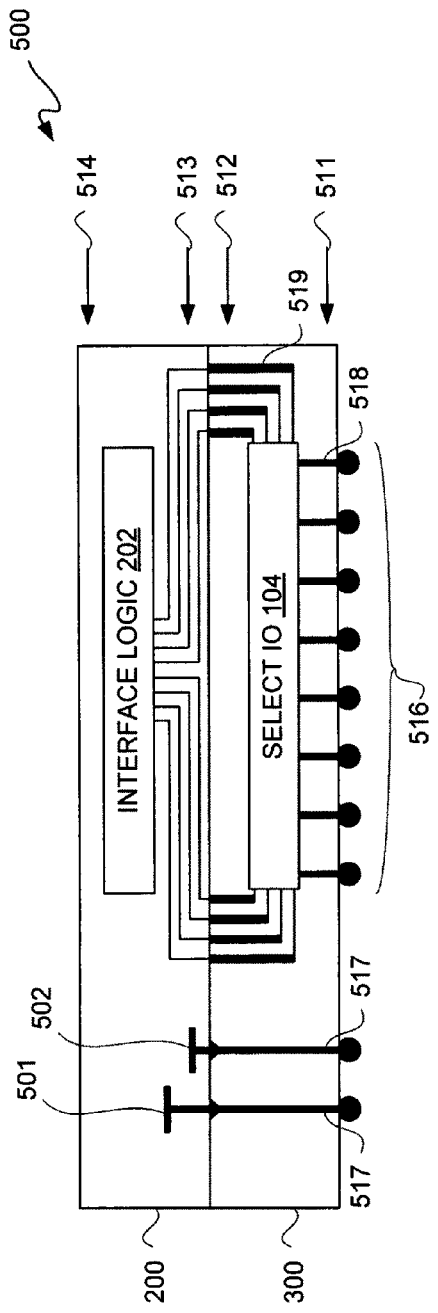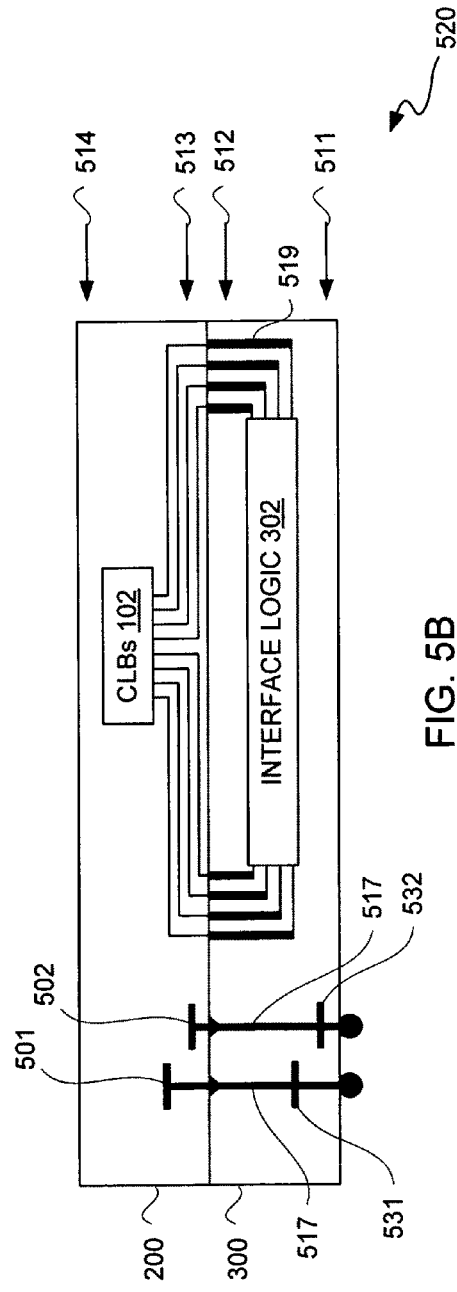

US 7,919,845 B2

FORMATION OF A HYBRID INTEGRATED CIRCUIT DEVICE

FIELD OF THE INVENTION

One or more aspects of the invention relate generally to integrated circuits and, more particularly, to formation of a hybrid integrated circuit device.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

One such FPGA is the Xilinx Virtex™ FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, programmable logic of an FPGA ("FPGA fabric") was on a same die as all other circuitry of the FPGA. However, while the FPGA fabric for example tended to push the state of the art of lithography for manufacturing integrated circuits, many other components of the FPGA did not. Thus, while some components of an FPGA may shrink with each new available lithographic process technology, other components do not likewise shrink with such newly available lithographic process technology.

This incongruity had significant cost implications. For example, lithography pushing the state of the art of manufacturing tends to involve transistors which are more sensitive to variations in semiconductor processing. Thus, even though base components manufactured with a less aggressive lithography would yield at a substantially higher rate, semiconductor dies were subject to the lower yield rate of the more aggressive, and thus more sensitive, semiconductor processing. Furthermore, complications associated with the manufacture of substantially disparately sized components may involve complications with respect to etch depths, number of metal layers, and other known process integration issues. Lastly, semiconductor process technology that pushes the lithographic state of the art for manufacturing tends to be more expensive per unit area of semiconductor die.

Accordingly, it would be desirable and useful to provide an integrated circuit device that avoids one or more of the above-mentioned problems.

SUMMARY OF THE INVENTION

One or more aspects of the invention generally relate to integrated circuits and, more particularly, to formation of a hybrid integrated circuit device.

An aspect of the invention relates generally to a method for forming a hybrid integrated circuit device. A design for an integrated circuit is obtained. The design is separated into at least two portions, the portions separated out responsive to component sizes. A first portion of the portions is associated for being formed using greater than or equal to a first minimum dimension lithography. A second portion of the portions is associated for being formed using greater than or equal to a second minimum dimension lithography, the second minimum dimension lithography being greater in size than the first minimum dimension lithography. A first die is formed for the first portion using at least in part the first minimum dimension lithography, the first die having the first minimum dimension lithography as a smallest lithography used for the forming of the first die. A second die is formed for the second portion using at least in part the second minimum dimension lithography, the second die having the second minimum dimension lithography as a smallest lithography used for the forming of the second die. The first die and the second die are attached to one another via coupling interconnects respectively thereof to provide the hybrid integrated circuit device.

Another aspect of the invention relates generally to a method for formation of a hybrid integrated circuit device. Components of an integrated circuit design are associated into cost categories, the cost categories broken out at least in part according to minimum lithographic dimensions used for forming the components. The integrated circuit is parsed into at least two component groups, a first group of the at least two component groups being associated with higher manufacturing cost due to use of smaller lithographic features than a second group of the at least two component groups. A first die is formed for the first group using greater than or equal to a first minimum dimension lithography and a second die is formed for the second group using greater than or equal to a second minimum dimension lithography. The first minimum dimension lithography has smaller feature sizes than the second minimum dimension lithography. The first die has the first minimum dimension lithography as a smallest lithography used for the forming of the first group. The second die has the second minimum dimension lithography as a smallest lithography used for the forming of the second group. The first die and the second die are each formed to include interconnects and other circuitry for coupling the first die and the second die to one another for providing the hybrid integrated circuit device.

Yet another aspect of the invention relates generally to a hybrid integrated circuit device having a first die and a second die, where the second die has pins for input and output connectivity and the first die has circuitry for storing information obtained via the pins and for outputting information via the pins. The first die and the second die represent separate portions of an integrated circuit product. The first die and the second die are coupled to one another, wherein the first die and the second die each include interconnects for coupling the first die and the second die to one another for electrical communication therebetween. The first die is associated with a first lithography for formation of a first feature size. The second die is associated with a second lithography for formation of a second feature size. The second feature size of the second die is larger than the first feature size of the first die, and the second die has no circuitry with the first feature size.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 2A and 2B in combination indicate what is on the FPGA die illustratively shown therein.

FIG. 5A is a block diagram depicting an exemplary embodiment of a cross-section of a portion of the integrated circuit device of FIG. 4B.

FIG. 5B is a block diagram depicting an exemplary embodiment of a cross-section of another portion of the integrated circuit device of FIG. 4B.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
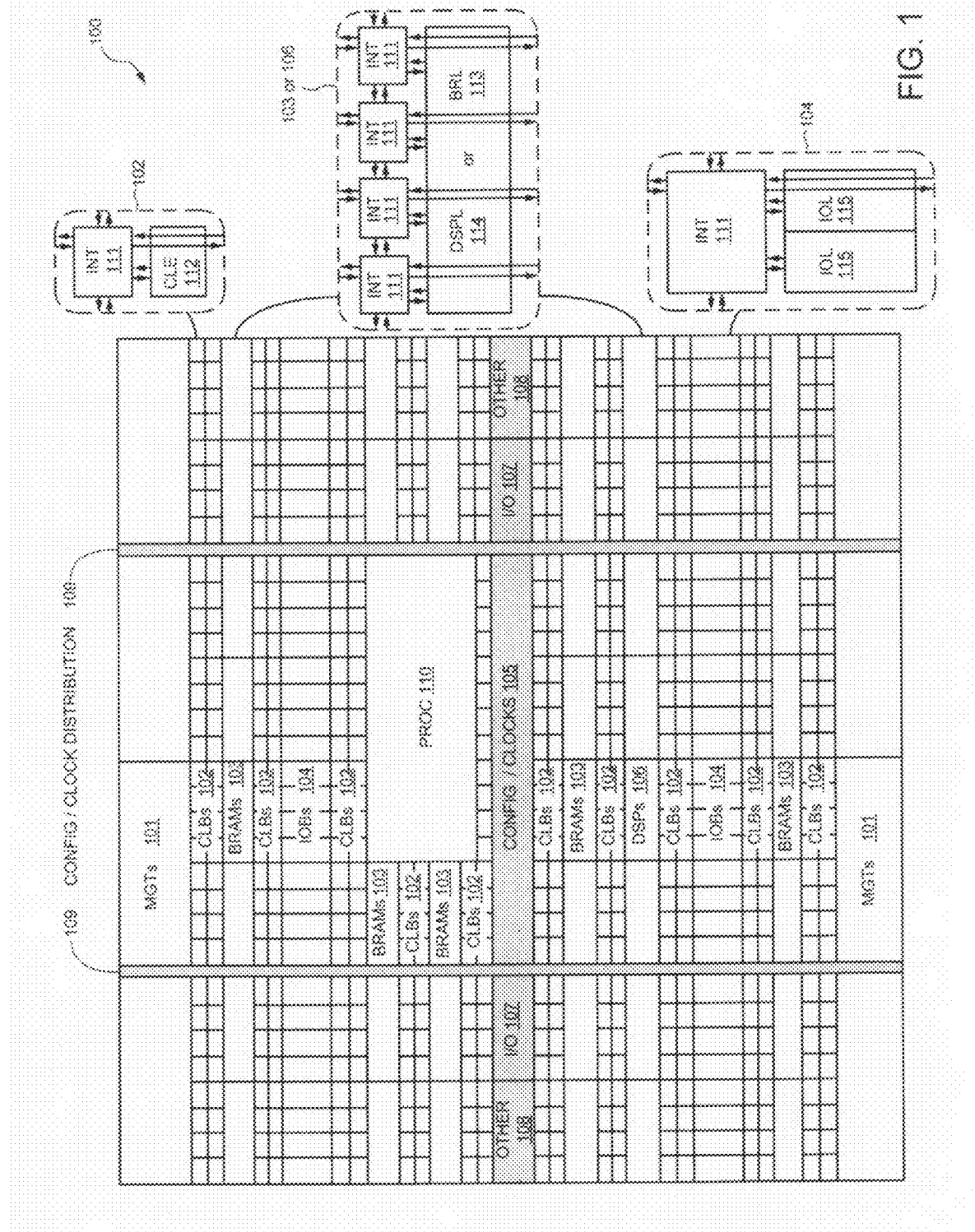
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ("IO") ports ("I/O"), 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex™-4 or Virtex™-5 FPGA from Xilinx of San Jose, Calif.

The following description is in terms of a least bifurcating an FPGA into two separate dies. Modern FPGA designs are effectively System-on-Chips ("SOCs"). However, not all components of an FPGA, namely not all functional blocks for example, need to be manufactured using the most advanced lithographic technology available. For example, with reference to current semiconductor lithography processes, some components of an FPGA design, such as select IOs (e.g., "IOBs"), serials IOs (e.g., "MGTs"), a system monitor, and other known components may be competitive when manufactured using a minimum lithography of 90 nanometers. In contrast, components such as CLBs, BRAMs, and other components, such as an embedded processor, and DSPs, of an FPGA may be competitive when manufactured using a 65 nanometer lithographic process. For instance, due to certain IO requirements, blocks such as IOBs or MGTs may not be able to take advantage of the smaller lithographic dimensions of cutting edge processes, and thus fabricating those blocks in older generation technology does not lead to any degradation in performance or efficiency.

By separating components, not according to functional capability, but rather by cost competitive lithography that may be used for forming such components, at least two groups of components may be identified for manufacturing on separate dies. These dies may then be interconnected and packaged as a single integrated circuit package, such that from the standpoint of a user, such single integrated circuit package functions in effect as a single-die FPGA. However, such hybrid integrated circuit device includes multiple die coupled to one another. This can result in significant cost savings, for example, if one of the separate dies can be formed in an older generation technology. In another example, certain components may require additional or more costly process steps in fabrication, and limiting one of the separate dies to those components can also yield cost savings. Also, using multiple smaller dies in place of a single large die, especially when the single large die must be manufactured in the newest lithographic or technology process, can mean fewer defective die and higher yields. As one of ordinary skill will appreciate, in general, separating a former single die integrated circuit into multiple die according to various technology requirements can result in many benefits, including cost savings, higher yields, more efficient circuits, etc.

Figure 2A:
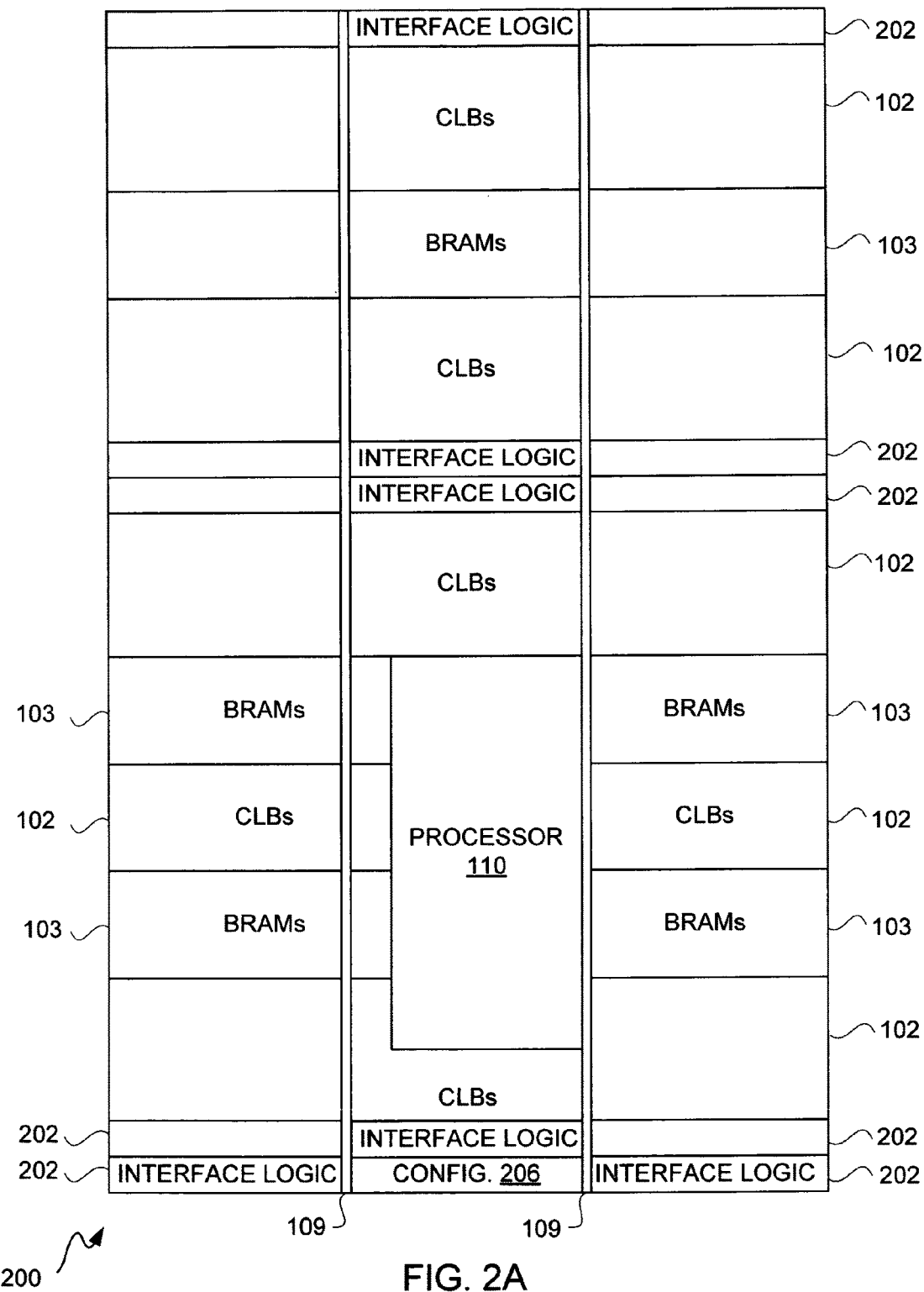
FIG. 2A is a block diagram depicting an exemplary embodiment of a portion of an FPGA die.
Figure 2B:
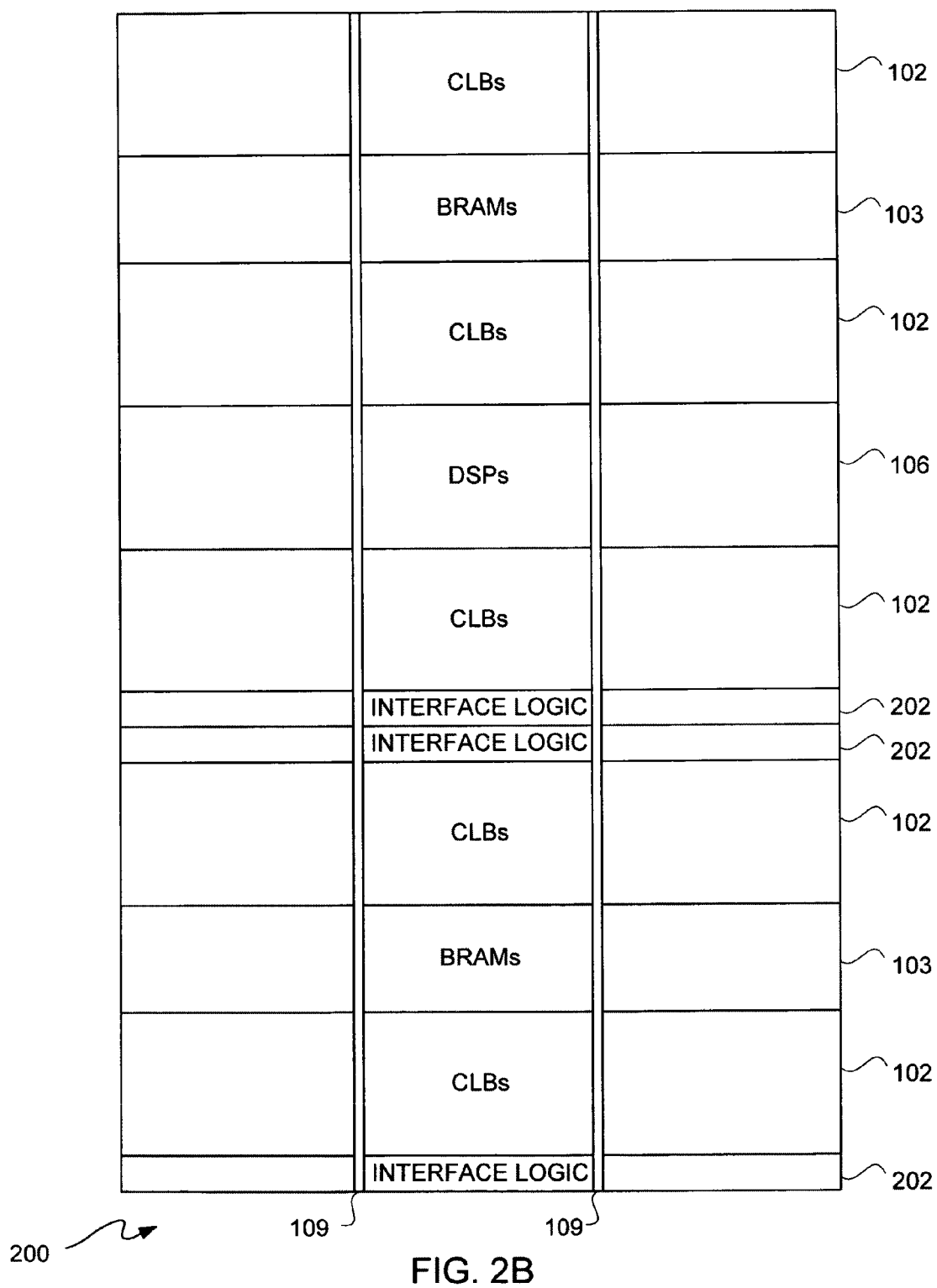
FIG. 2B is a block diagram depicting an exemplary embodiment of another portion of the FPGA die of FIG. 2A.

FIG. 2A is a block diagram depicting an exemplary embodiment of a portion of an FPGA die 200. FIG. 2B is a block diagram depicting an exemplary embodiment of another portion of FPGA die 200 of FIG. 2A. FIGS. 2A and 2B in combination indicate what is on FPGA die 200.

FPGA die 200 may be manufactured using a state of the art lithography for manufacture of integrated circuits, such as FPGAs. Currently, FPGA die 200 may be manufactured using a 65 nanometer ("nm") lithography. It should be appreciated that even though a 65 nm lithography is used for smallest dimensioned components of FPGA die 200, other components of FPGA die 200 may be manufactured using greater feature sizes, namely one or more larger lithographies larger than 65 nm.

With simultaneous reference to FIGS. 2A and 2B, FPGA die 200 includes CLBs 102, BRAMs 103, DSPs 106, and embedded processor 110. Traces for clock buses associated with areas 109 are used to distribute clock signals across the breadth of FPGA die 200. Traces associated with areas 109 may be lower order leaves of a clock tree. Included with FPGA die 200 is configuration port logic 206. Configuration port logic 206 is coupled to buses or traces also represented by areas 109 for distributing configuration signals across the breadth of FPGA die 200. Configuration port logic 206 may included with FPGA die 200 to couple configuration bit distribution/programming more closely with configuration memory cells.

Further included in FPGA die 200 is interface logic 202. Interface logic 202 is for coupling signals to and from FPGA die 200 to another die, namely IO die 300 of FIG. 3. Interface logic 202 may include programmable interconnect points ("PIPs") (not shown in FIGS. 2A and 2B). As PIPs are known, they are not described in unnecessary detail herein. Additionally, interface logic 202 may include traces or lines (not shown in FIGS. 2A and 2B) for interconnecting signals, as well as interconnecting power and ground voltages, as described below in additional detail.

Figure 3:
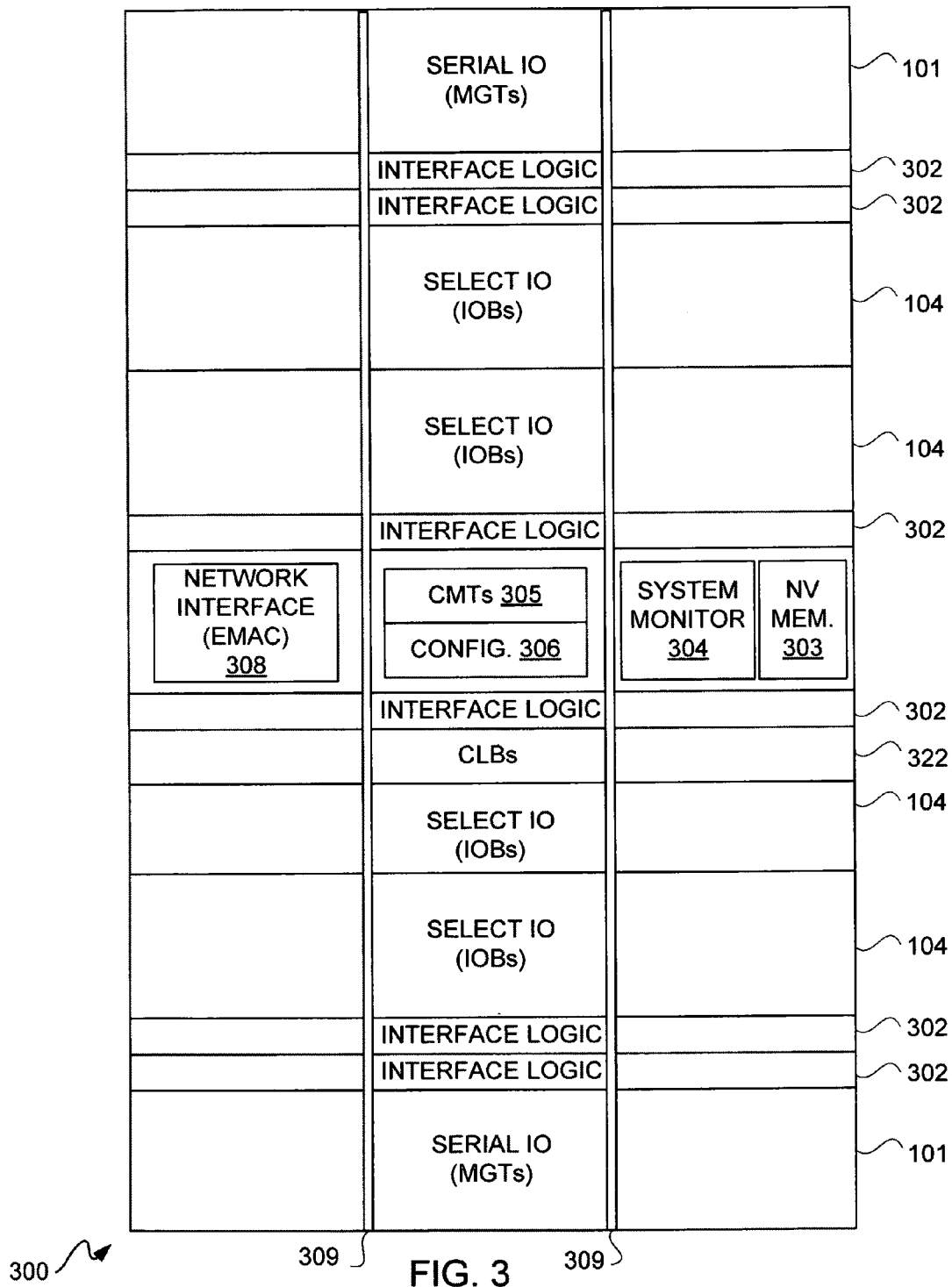
FIG. 3 is a block diagram depicting an exemplary embodiment of an input/output die for use with an FPGA die such as that illustratively shown in FIGS. 2A and 2B.

It should be appreciated that FPGA die 200 has a higher circuit density than IO die 300 of FIG. 3. Consequently, even though FPGA die 200 of FIGS. 2A and 2B may appear as illustratively shown to be larger than IO die 300 of FIG. 3, it should be appreciated that in actuality FPGA die 200 may be of equal or smaller size than IO die 300 of FIG. 3.

While components of FPGA die 200 may be shrunk, for instance as technology improves, components of IO die 300 of FIG. 3 may not be shrunk on a subsequent generation of an FPGA. Moreover, FPGA die 200 may be formed using a 65 nm semiconductor lithographic process technology, and IO die 300 of FIG. 3 may be formed using a 90 nm semiconductor lithographic process technology. Each of these examples of 65 nm and 90 nm lithographies is the largest lithography that may be used with reference to dies 200 and 300, respectively. However, it should be appreciated that smaller lithographies than those specifically mentioned may be used on dies 200 and 300. In general, two manufacturing technologies may be used to manufacture each die, where the manufacturing technologies are different in at least one way. As described herein, the two technologies may have different size lithographies, but other differences, such as materials and chemicals used or processing steps and/or machinery, may also exist.

Prior to use of 65 nm lithographic technology, CLBs and BRAM layouts of an FPGA covered more than 90 percent of the semiconductor area consumed by an FPGA. However, with use of 65 nm lithographic technology, CLB and BRAM layouts consume approximately only 50 to 70 percent of FPGA die area, depending on die size, when a single die FPGA device was used. That is, as CLB and BRAM portions shrink faster than other portions, they occupy a smaller percentage of the die.

FIG. 3 is a block diagram depicting an exemplary embodiment of an IO die 300 for use with an FPGA die 200 of FIGS. 2A and 2B. Even though a columnar architecture is shown for both of dies 200 and 300, it should be appreciated that other architectures, such as a known ring architecture where pins that provide access to the outside world are distributed around the perimeter of the die, may be used. However, with respect to the columnar architecture, associated columns may be aligned such that they are proximal to one another to facilitate attaching interconnects of dies 200 and 300 to one another. With simultaneous reference to FIGS. 2A, 2B, and 3, FPGA die 200 and IO die 300 are further described.

IO die 300 includes serial IO (e.g., MGTs) 101, select IO (e.g., IOBs) 104, clock management tiles ("CMTs") 305, and configuration port logic 306, as well as interface logic 302. IO die 300 may further include a network interface, such as Ethernet media control ("EMAC") block 308, a system monitor 304, and non-volatile memory 303. Non-volatile memory 303 may be associated with electrically erasable programmable read only memory ("EEPROM"), flash memory, or other known non-volatile memory. Additionally, e-fuses and electro-static discharge ("ESD") protection circuitry, not shown, may be included as part of IO die 300.

For an FPGA, configuration port logic 306 may be included for configuration of IO die 300, as well passing configuration signals up to configuration port logic 206 of FPGA die 200. Furthermore, IO die 300 may include CMTs 305 for local distribution of clock signals on IO die 300. Configuration signals and clock signals may be distributed via buses or traces as indicated by areas 309 for the breadth of the IO die 300. Buses or traces for clock signals of areas 309 may include branches and higher order leaves of a clock tree.

It should be appreciated that CMTs 305 may have coarse- and fine-grained DLLs, or more particularly tapped delay lines associated with such DLLs. Alternatively or in addition to DLLs, PLLs and/or other clocking and timing circuits may be used. The amount of programmable logic on IO die 300 may be substantially less than on FPGA die 200, and configuration port logic 306 may be less complex than configuration port logic 206. Furthermore, it should be appreciated that CLBs 322 may optionally be included as part of IO die 300, where such CLBs 322 are formed using a larger lithography than CLBs 102 of FIGS. 2A and 2B. CLBs 322 formed using a larger lithography generally tend to have less leakage current due to less leaky transistors than those formed with a smaller lithography. Thus, CLBs 322 formed using such larger lithography may have lower static power.

Interface logic 202 and 302 may be used to pass signals between IO die 300 and FPGA die 200. Furthermore, interface logic 202 of FPGA die 200 may be used to couple IOBs 104 or MGTs 101 for example of IO die 300 to provide signaling to FPGA die 200 of an integrated circuit device formed of IO die 300 and FPGA die 200. Likewise, interface logic 302 of IO die 300 may be coupled to CLBs 102, BRAMs 103, or DSPs 106 for example of FPGA die 200 to provide signaling from FPGA die 200 to IOBs 104 or MGTs 101 for example of IO die 300 to communicate off-chip of such a multi-die device.

It should be appreciated that developments in manufacturing of advanced technology integrated circuits have increased substantially. Therefore, for a multi-die device, having one die which does is not manufactured using the most advanced lithographic technology may allow for cost reduction, including less layout complexity. Furthermore, it should be appreciated that each die of a multi-die device may be tested individually, and thus if the most advanced lithography technology die (e.g., FPGA die 200) has a higher failure rate, namely a lower yield rate, such die may be weeded out before being attached to the higher yielding die (e.g., IO die 300).

IO die 300 may be attached to FPGA die 200, as described below herein in additional detail, and both may be provided as a single device, such that the "split" is not transparent to users.

Figure 4A:
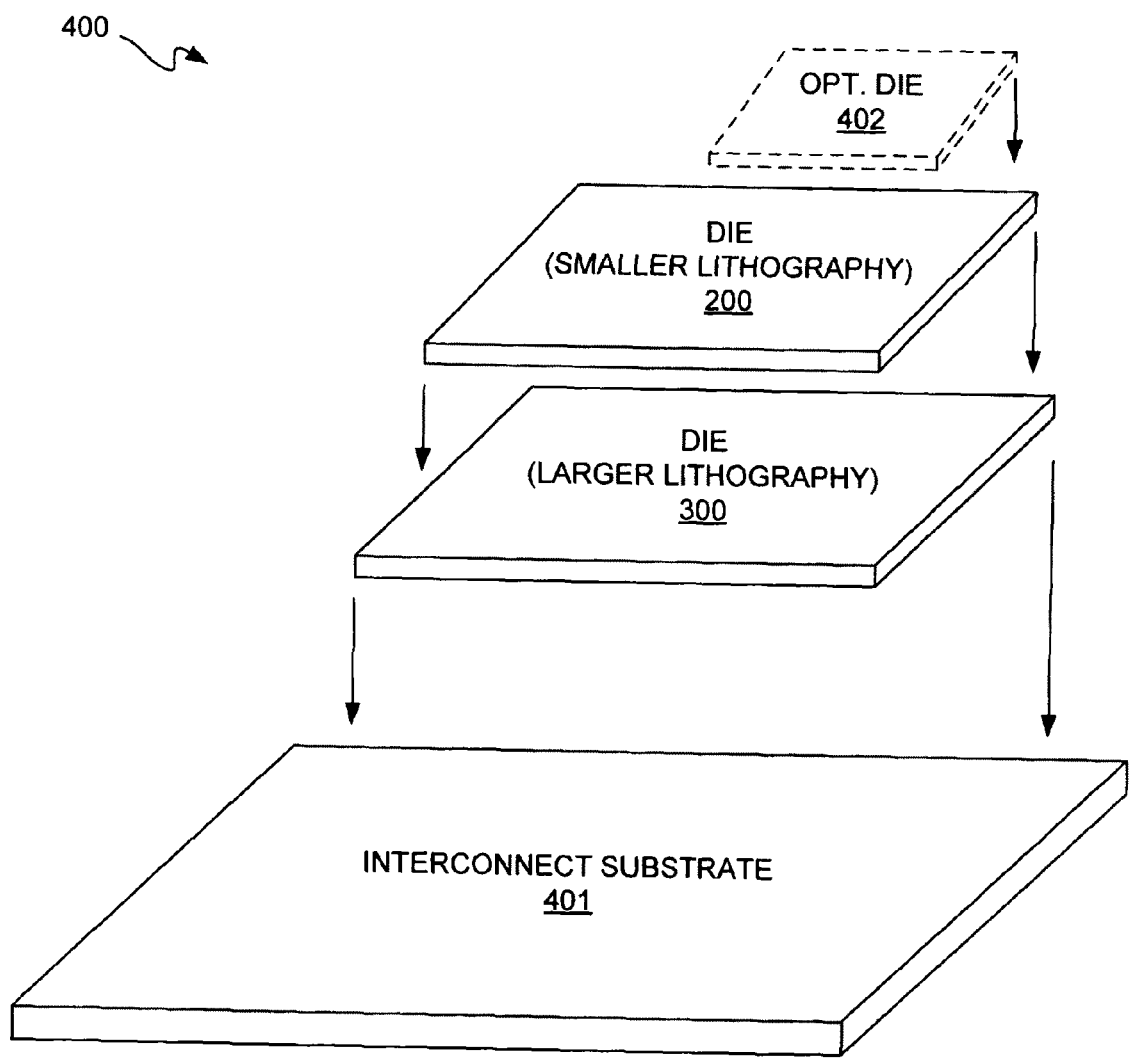
FIG. 4A is a perspective view depicting an exemplary embodiment of an in-process semiconductor device.

With reference to FIG. 4A where there is shown a perspective view depicting an exemplary embodiment of an in-process semiconductor device 400, FPGA die 200 is more generally referred to as a smaller lithography die or a increased-cost die, and IO die 300 is more generally referred to as a larger lithography die or a reduced-cost die. FPGA die 200 may be attached to IO die 300 which in turn is attached to an interconnect substrate 401. Each die may be floor planned to align interface logic 202 and 302 of FIGS. 2A, 2B, and 3 (not shown in FIG. 4A) with corresponding circuitry associated therewith. Such positioning of interface logic 202 and 302 may be to further accommodate differences in sizing of features as between the various die.

One or more separate optional daughter die 402 may be attached to an FPGA die 200, where optional daughter die 402 is a separate core. For example, rather than having embedded processor 110 of FIG. 2A (not shown in FIG. 4A) on FPGA die 200, optional daughter die 402 may be a processor die. In general, a daughter die may have any suitable function or functions. Moreover, optional die 402 may include more than one processor, and may include a processor and a coprocessor. Furthermore, IO die 300 may have more area available for "pin-outs" due to having lower density circuitry than FPGA die 200, and thus interconnect substrate 401 may be omitted, as there may be sufficient space for pin-outs in IO die 300. However, for purposes of clarity by way of example and not limitation, it shall be assumed that interconnect substrate 401 is used.

Figure 4B:
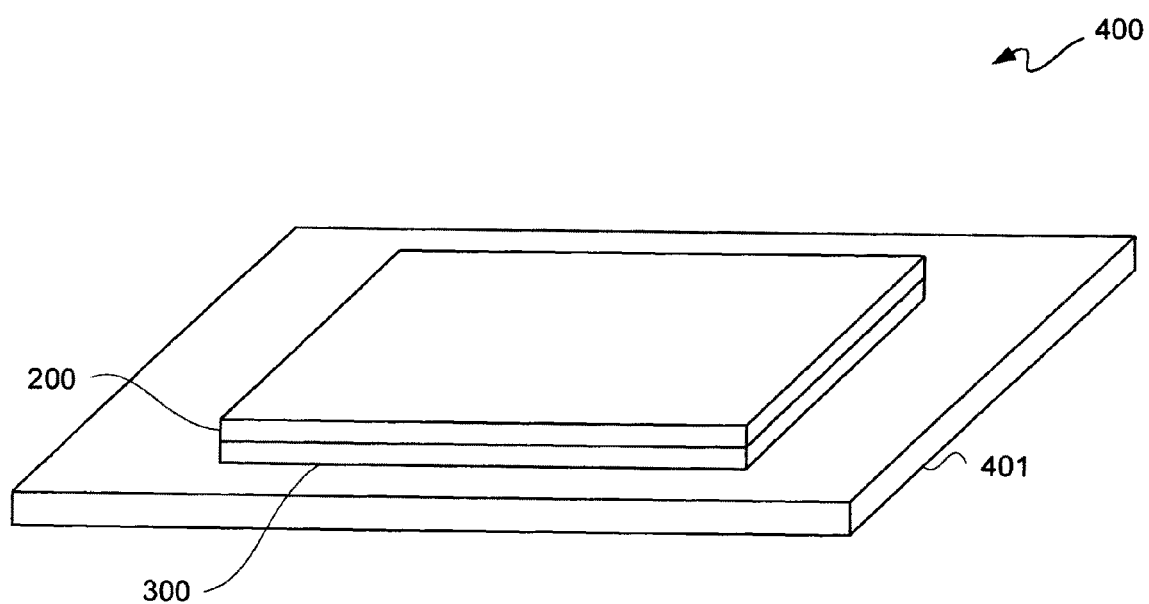
FIG. 4B is a perspective view depicting an exemplary embodiment of a pre-mold compound, assembled integrated circuit device.

Referring to FIG. 4B, there is shown a perspective view depicting an exemplary embodiment of an assembled integrated circuit device 400 prior to mold compound being applied. In this example, optional daughter die 402 of FIG. 4A has been omitted for purposes of clarity and not limitation. In this configuration, it should be appreciated that IO die 300 is used to communicate with the "outside world," that is with systems or devices external to the hybrid device, and to communicate with FPGA die 200. Accordingly, it should be appreciated that conventional multi-chip packaging may be used for packaging integrated circuit device 400.

Thus, it should be appreciated that IO die 300 may have added to it sufficient vias for clock, IO, power, and ground connections, among other known pin connections, for communicating with external devices and for communicating with and powering FPGA die 200. IO die 300, which may have more available area, may bear the greater impact for the addition of additional interconnects and vias.

The impact of added interconnects and vias may not be a significant additional cost, especially when viewed with respect to one or more of the below-described advantages created by separating out die. Furthermore, FPGA die 200 may connect to such additional interconnects and vias with one or more top metal layers, which would allow metal layers below such one or more top metal layers to be used for conventional interconnecting circuitry of an FPGA with respect to CLBs 102, BRAMs 103, and DSPs 106 for example.

Although optional daughter die 402 is not illustratively shown in FIG. 4B, it should be appreciated that FPGA die 200 may allocate area for connections to such optional die, including power and ground as well as signaling connections. Furthermore, it should be appreciated that as technology and the design and architecture moves forward, either or both dies 200 and 300 may move forward at their own relative pace. For example, this would allow FPGA die 200 to be implemented on a new semiconductor process generation without having to redesign circuitry of IO die 300 (i.e., IO die 300 may be reused). Thus, a multi-die implementation would reduce risk, as well as enhance time to market, for a product generated in part using a new semiconductor process generation.

FIG. 5A is a block diagram depicting an exemplary embodiment of a cross-section of a portion 500 of integrated circuit device 400 of FIG. 4B. FIG. 5B is a block diagram depicting an exemplary embodiment of a cross-section of a portion 520 of integrated circuit device 400 of FIG. 4B. Portions 500 and 520 respectively of FIGS. 5A and 5B are further described with simultaneous reference to FIGS. 4B, 5A, and 5B.

FPGA die 200 includes interface logic 202 and CLBs 102, as respectively shown in portions 500 and 520. IO die 300 includes select IO 104 and interface logic 302, as respectively shown in portions 500 and 520. A top portion of IO die 300 is indicated with arrow 512 and a bottom portion of IO die 300 is indicated by arrow 511. By bottom portion 511, it is generally meant that a substrate upon which IO die 300 is formed is in the bottom portion, and from there built up are one or more layers including one or more metal layers associated with top portion 512.

FPGA die 200 has a bottom portion 514 and a top portion 513. FPGA die 200 may be inverted for attachment to IO die 300, as is illustratively shown in FIGS. 5A and 5B. In some cases, other arrangements or methods for attaching the two die may be used, such as wire bond, flip-chip, through-die vias, etc. Thus, vias 519 of IO die 300 may couple traces or conductive lines of dies 200 and 300. Select IO 104 of IO die 300 is illustratively shown as being interconnected using vias 519 to interface logic 202 of FPGA die 200. Furthermore, I/O 516 may be coupled via conventional Ball Grid Array ("BGA") or like technology to select IO 104 of IO die 300 by vias 518. Thus, vias 518 may extend through a semiconductor substrate associated with IO die 300. Furthermore, vias 517 may be used for coupling power and ground to respective buses, namely power bus 501 and ground bus 502. Vias 517 extend through IO die 300 for connecting to vias of FPGA die 200 associated with power and ground buses 501 and 502, respectively. Vias 517 need not be exclusively for power and ground busing of FPGA die 200. For example, as illustratively shown in FIG. 5B, a power bus 531 and a ground bus 532 of IO die 300 may be coupled to vias 517, which are also coupled to power bus 501 and ground bus 502 of FPGA die 200.

Furthermore, with reference to FIG. 5B, it should be appreciated that for intra-integrated circuit device signaling, namely signaling between die 200 and 300, there may not be any externally associated connection, and thus interface logic 302 of IO die 300 may be coupled to CLBs 102 of FPGA die 200 for example.

In FIGS. 5A and 5B, die 200 is attached to die 300 using known microbond technology. Die 300 may use flip-chip technology for attaching to interconnect substrate 401 of FIG. 4. Alternatively or in combination with flip-chip technology, wire bonding may be used to interconnect die 300 and interconnect substrate 401.

Figure 5C:
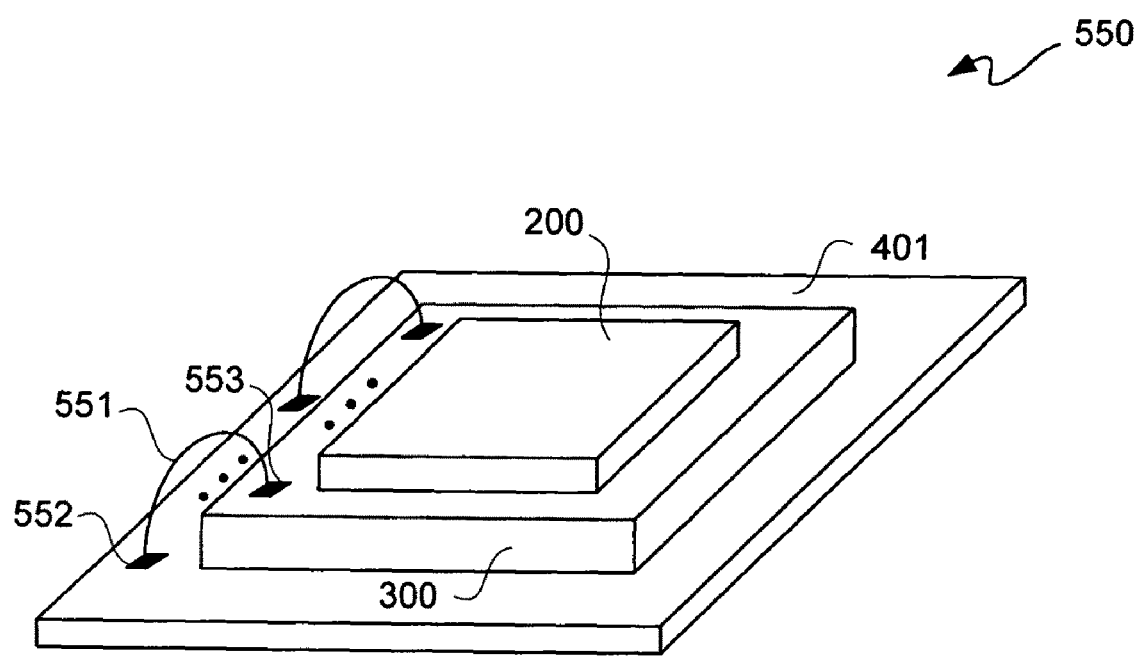
FIG. 5C is a perspective view depicting an exemplary embodiment of an in-process semiconductor device.

In FIG. 5C, there is shown a perspective view depicting an exemplary embodiment of an in-process semiconductor device 550. In this example embodiment, FPGA die 200 has a smaller perimeter than IO die 300. With bottom portions 511 and 514 at opposing ends as described with reference to FIGS. 5A and 5B and metal layers of dies 200 and 300 are microbonded together, wire bonding may be used at least in part for providing interconnects between interconnect substrate 401 and IO die 300. For example, wires 551 are attached at each end to respective bond pads 552 disposed on an upper surface of interconnect substrate 401 and respective bond pads 553 disposed on an upper surface of IO die 300. Even though only one side is illustratively shown for purposes of clarity, wire bonds may be located around the entire exposed upper surface perimeter of IO die 300. Wire bonding may be used in addition to or instead of flip-chip technology for interconnecting IO die 300 and interconnect substrate 401. Furthermore, wire bonding may be used to interconnect FPGA die 200 and interconnect substrate 401, though not illustratively shown in FIG. 5C, thereby bypassing IO die 300. Of course, IO die 300 and FPGA die 200 are still interconnected to one another such as via microbonding.

Figure 6:
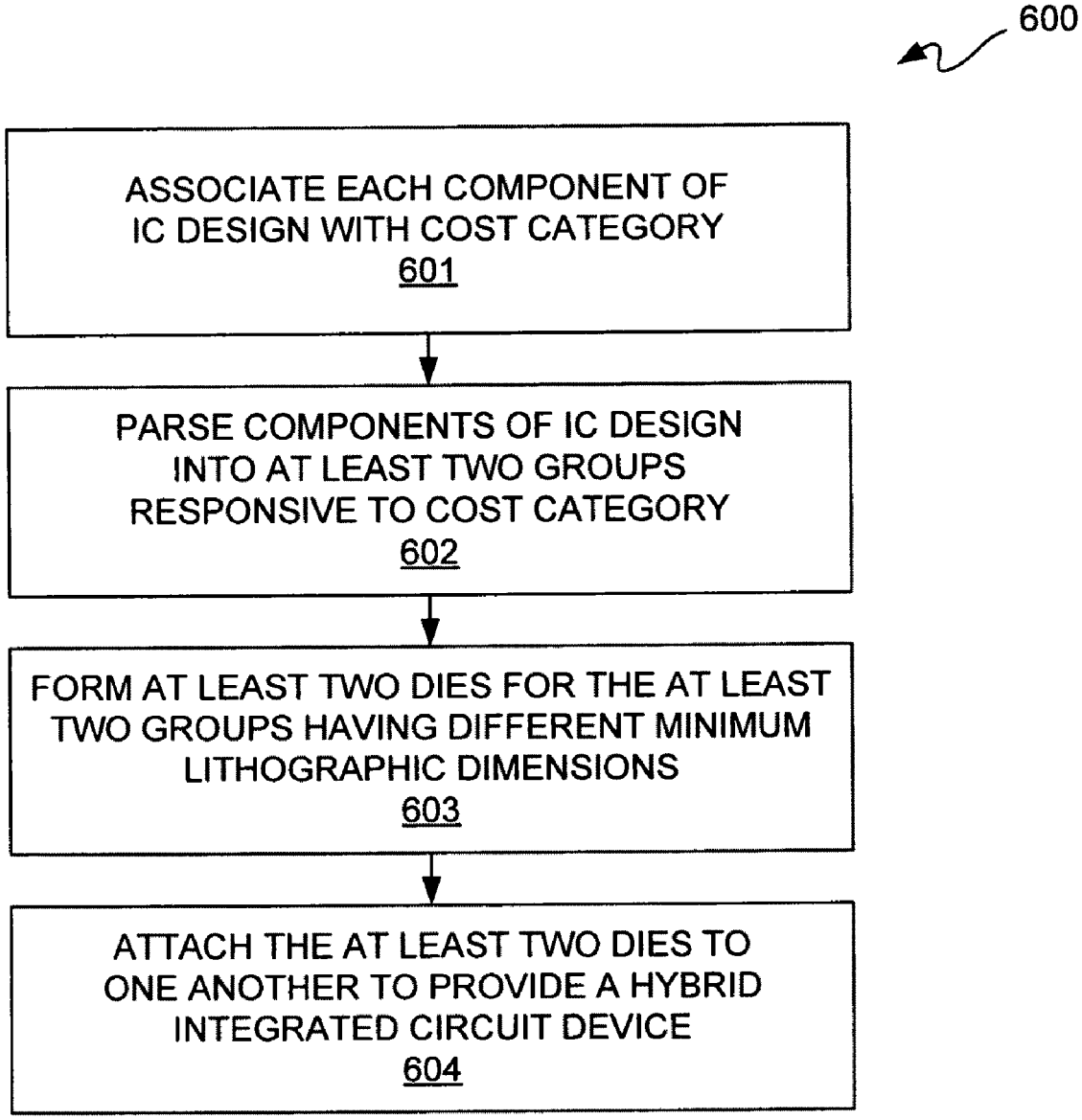
FIG. 6 is a flow diagram depicting an exemplary embodiment of an integrated circuit formation flow.

FIG. 6 is a flow diagram depicting an exemplary embodiment of integrated circuit formation flow 600. At 601, an integrated circuit ("IC") design is obtained and components associated with such IC design are associated with a cost category. These cost categories take into account the size of the component to be formed and thus the associated minimum dimension lithography or lithographies and/or other different types of semiconductor processing to be used for formation of such component in a semiconductor process. Other factors that may impact the cost include the size of the wafer to be used and the die size to be used for example.

At 602, the IC components associated with cost categories at 601 are parsed into at least two groups responsive to their various cost categories. In other words, components of an IC design may be divided into two groups, to separate smaller dimension lithography components and larger dimension lithography components from one another. Continuing the above example for purposes of clarity by way of example and not limitation, it shall be assumed that these two groups of components are 65 nm components and 90 nm components where the 65 nm and 90 nm do not necessarily indicate the minimum feature size but rather the minimum dimension lithography used to make one or more components within such group. In general, components may be separated into a group associated with reduced cost manufacturing and a group associated with increased cost manufacturing.

At 603, at least two dies are formed for the at least two groups parsed at 602, where such at least two groups have different minimum lithographic dimensions. Thus, the minimum dimension lithography used for one group in the example is 65 nm lithography and the minimum dimension lithography used for the other group of components is 90 nm lithography. After forming the at least two dies, they may be attached to one another to provide a hybrid integrated circuit device at 604. Known steps, such as testing for example, have not been described for purposes of clarity. However, it should be appreciated that each individual die may be processed conventionally and then tested, for example via probe pads. After the at least two dies are attached to one another, the dies may be tested yet again in a conventional manner, as such a hybrid integrated circuit device generated at 604 may appear as a single chip even though it is a multi-die or hybrid integrated circuit device.

A number of advantages may be obtained from using one or more separate FPGA and IO dies 200 and 300, respectively. For example, FPGA die 200 may be manufactured with a lithography which provides approximately a 25 to 75 percent shrinkage compared to the minimum dimension lithography used for manufacturing 10 die 300. Furthermore, because additional space may be available on IO die 300, all or some additional circuitry, such as additional e-fuses, flash memory, voltage regulators and charge pumps, may be added to IO die 300. For example, additional voltage regulators and charge pumps may be used for creating special voltages. Alternatively or additionally, larger capacitors for enhanced power smoothing may be used with IO die 300, and a bitwise larger analog-to-digital converter for system monitor 304 may be used for greater accuracy. Furthermore, because at least a majority of the circuitry on FPGA die 200 would be formed using the more advanced lithographic processes and because FPGA die 200 would be smaller than a conventional FPGA die, there may be more FPGA dies 200 per wafer. Having more dies per wafer and more uniform semiconductor processing of such wafer further reduces cost. Furthermore, because IO die 300 does not have the routing complexity associated with FPGA die 200, fewer metal layers may be on IO die 300 which may further reduce costs. Likewise, with respect to IO die 300, more dies may be manufactured on a single wafer using less expensive semiconductor processing, thus lowering the cost. Furthermore, there may be fewer transistor types with respect to each individual die of dies 200 and 300 in comparison to a conventional, single-die FPGA, and thus having fewer transistor types may further reduce semiconductor manufacturing costs.

Other advantages may be obtained from having a separate IO die 300 and FPGA die 200. For example, different options may be provided by changing only serial IO die 300. For example where serial 10 is not included, and thus connections associated with such serial 10 may be omitted, IO die 300 may be manufactured to omit such serial 10 without correspondingly changing the manufacturing of FPGA die 200. Furthermore, features on IO die 300 may go unused by a particular FPGA die 200, and thus a high percentage of IO die 300 may be used by having a strategy where an IO die 300 with defects of one or more features may be used with an FPGA die 200 not requiring use of those one or more features. Along those lines, FPGA die 200 may be shorter than IO die 300, allowing a portion of select IO and serial IO in each column of IO die 300 to be reserve circuitry available to increase defect tolerance.

Advantages associated more particularly with FPGA die 200 may be that the number of SPICE models is streamlined, such that there are less designer hours used. Thus, optimization of FPGA die 200 at a development stage may not trigger as large a ripple effect on computer resources through a design community, and thus may lessen impact on schedule and product introduction. Furthermore, by having an FPGA die 200, as well as associated circuitry thereof, more homogeneous with respect to semiconductor processing than a single-die FPGA, process integration is simplified as less types of gate oxides, metal layers, and other features associated with semiconductor processing are implemented. Having more homogeneity with respect to semiconductor features and associated process steps may enhance yield and provide a faster turn-around time with fewer wafer and lithographic mask costs. Furthermore, ESD and latch-up layout area overhead due to non-homogeneity may be substantially removed from FPGA die 200, which may further reduce costs.

Advantages associated more particularly with IO die 300 may include use of mature processing and SPICE models, which may promote more streamlined design and manufacturing. Furthermore, as previously mentioned, IO die 300 may be readily designed for different applications though with a common or base feature set. For example, automotive applications may involve different IO and ESD protection overhead as compared with IO and ESD protection used in telecommunication applications. Thus, separate IO dies 300 may be tailored to particular market segments, while FPGA dies 200 used with such various IO dies 300 may be unchanged or at least substantially unchanged.

The examples of 65 nm and 90 nm lithographies have been used herein for possible minimum dimension lithographies used to form FPGA die 200 and IO die 300. It should be appreciated that minimum feature size using 65 nm lithography, for example, may be substantially smaller than 65 nm. For example, minimum feature size using 65 nm may approach half the value of 65 nm. Furthermore, with respect to 65 nm processing, the wavelength of light used is actually 193 nm or 248 nm. Various phase shifting masks may be used to make sub-wavelength features, as is known. However, the scope of this description is not limited to 65 nm and 90 nm lithographic processes, but may involve other types of processes which presently are not used in mainstream manufacturing, but may one day be more commonly used. For example, FPGA die 200 may be manufactured using an x-ray lithography, and IO die 300 may be manufactured using a photolithography, as respective minimum dimension lithography. Alternatively, FPGA die 200 may be manufactured using a direct write, such as an e-beam lithography, and IO die 300 may be manufactured using a photo or x-ray lithography. In each of the above examples, the type of lithography is associated with a minimum dimension lithography used in forming the various dies, which does not preclude use of larger lithographies than such minimum lithographies in the formation of such dies.

As indicated above, because some components are shrunk more aggressively than others, Moore's Law may be thought of more accurately as the ratio between groups of components with respect to how much FPGA die area is consumed for layout of each. However, some components, while capable of being scaled down, are not scaled down due to external factors. For example, devices having to withstand high voltage or high current may not be scaled down, not because of the structure of the device, but due to the operating parameters which the device is to withstand. Furthermore, a semiconductor process flow may use a same lithography throughout the process flow, where larger-sized components are not formed taking advantage of the capability to form smaller feature sizes associated with the lithography. However, generally, the larger the lithography, the lower the cost to manufacture.

Thus, returning to 601, components may be separated out into two groups, namely those that are shrunk with each lithographic generation and those that are not shrunk with each lithographic generation. These will also fall into two separate cost categories, as indicated above, even though the index for sorting is scalability. By associating components of an integrated circuit design into scalability categories, the scalability categories may be broken out at least in part according to maximum lithographic dimensions that may respectively be used for forming the components while being within or at least meeting design constraints. The term "design constraints" is meant to include operating parameters, as well as die size constraints.

At 602, the components may thus be parsed into the two categories of those to be scaled with the advanced production lithography and those not to be scaled with the advanced production lithography. At 603, the two dies may be formed. One die, namely the one in the to-be-scaled category, may be formed entirely using the advance production lithography. The other die, namely the one not to be scaled with the advanced production lithography, is formed entirely using a prior or older generation of lithography. Transistors in the first group formed using the advance production lithography will have a feature size ("F") that is too small to be formed using the prior or older generation lithography. Again, at 604, the two dies may be attached to one another for providing a hybrid integrated circuit device.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, even though the example of an FPGA has been used, the scope of the above description applies to other known integrated circuit products. Thus, any integrated circuit product that can be separated out based on lithography, where generally low-density circuitry is formed on one die and high-density circuitry is formed on another die, may be provided as a multi-die integrated circuit device. Claim(s) listing steps do not imply any order of the steps. Trademarks are the property of their respective owners.

What is claimed is:

1. A hybrid integrated circuit device, comprising:
    a first die;
    a second die having pins for input and output connectivity;
    the first die having circuitry for storing information obtained via the pins and for outputting information via the pins;
    the first die and the second die representing separate portions of an integrated circuit product;
    the first die and the second die coupled to one another, wherein the first die and the second die each include interconnects for coupling the first die and the second die to one another for electrical communication therebetween;

the first die having transistors formed using a first lithography;

the second die having transistors formed using a second lithography;

the transistors formed using the second lithography of the second die being larger than the transistors formed using the first lithography of the first die; and the second die having no circuitry with transistors formed using the first lithography.

2. The hybrid integrated circuit device according to claim 1, wherein the first die comprises programmable resources and internal random access memory; and wherein the second die comprises input/output circuitry.

3. The hybrid integrated circuit device according to claim 1, wherein the first die is separately manufacturable from the second die.

4. The hybrid integrated circuit device according to claim 1, wherein the first die and the second die are coupled to one another via microbonding; and wherein the first die includes a flip-chip interface for coupling to an interconnect substrate.

5. The hybrid integrated circuit device according to claim 1, wherein the first die and the second die are coupled to one another via microbonding; and wherein a portion of an upper surface area of the first die is exposed for wirebonding thereto even after the first die and the second die are coupled to one another.

6. The hybrid integrated circuit device according to claim 5, wherein the first die and the second die in combination provide a programmable logic device.

7. A hybrid integrated circuit device, comprising a first die having transistor dimensions greater than or equal to a first minimum dimension lithography; and a second die coupled to receive the first die and having transistor dimensions greater than or equal to a second minimum dimension lithography, the second minimum dimension lithography being greater in size than the first minimum dimension lithography, wherein the first die and the second die each include interconnects for enabling electrical communication therebetween and the second die has pins for input and output connectivity.

8. The hybrid integrated circuit device according to claim 7, wherein an interface portion of the first die is coupled to an interface portion of the second die.

9. The hybrid integrated circuit device according to claim 7, wherein the first die includes at least one circuit selected from the group consisting of random access memory, programmable logic, an embedded processor, and digital signal processing blocks; and wherein the second die includes at least one circuit selected from the group consisting of multi-gigabit transceivers, input/output blocks, and a network interface.

10. The hybrid integrated circuit device according to claim 9, wherein the second die further includes at least one circuit selected from the group consisting of configuration ports, a system monitor, clock management tiles, and non-volatile memory.

11. The hybrid integrated circuit device according to claim 7, wherein the first minimum dimension lithography is approximately 25 to 75 percent smaller than the second minimum dimension lithography.

12. The hybrid integrated circuit device according to claim 7, wherein the first minimum dimension lithography is an x-ray lithography and the second minimum dimension lithography is a photolithography.

13. The hybrid integrated circuit device according to claim 7, wherein the first minimum dimension lithography is a direct write lithography and the second minimum dimension lithography is a photolithography.

14. The hybrid integrated circuit device according to claim 7, wherein the first minimum dimension lithography is a direct write lithography and the second minimum dimension lithography is an x-ray lithography.

15. The hybrid integrated circuit device according to claim 7 wherein one of the first die and the second die comprises an upgraded die.

\* \* \* \* \*